US012653056B2

(12) United States Patent
Bajwa et al.

(10) Patent No.: US 12,653,056 B2
(45) Date of Patent: Jun. 9, 2026

(54) BONDING SYSTEMS FOR BONDING A SEMICONDUCTOR ELEMENT TO A SUBSTRATE, AND RELATED METHODS

(71) Applicant: Kulicke and Soffa Industries, Inc., Fort Washington, PA (US)

(72) Inventors: Adeel Ahmad Bajwa, Fort Washington, PA (US); Thomas J. Colosimo, Jr., Fort Washington, PA (US); Matthew B. Wasserman, Fort Washington, PA (US); Robert N. Chylak, Fort Washington, PA (US)

(73) Assignee: Kulicke and Soffa, Industries, Inc., Fort Washington, PA (US)

( * ) Notice: Subject to any disclaimer, the term of this patent is extended or adjusted under 35 U.S.C. 154(b) by 367 days.

(21) Appl. No.: 18/227,202

(22) Filed: Jul. 27, 2023

(65) Prior Publication Data
US 2024/0063169 A1     Feb. 22, 2024

Related U.S. Application Data

(60) Provisional application No. 63/398,328, filed on Aug. 16, 2022.

(51) Int. Cl.
H10W 72/00          (2026.01)

(52) U.S. Cl.
CPC ...... *H10W 72/0711* (2026.01); *H10W 72/072* (2026.01); *H10W 72/016* (2026.01); *H10W 72/07125* (2026.01)

(58) Field of Classification Search
None
See application file for complete search history.

(56) References Cited

U.S. PATENT DOCUMENTS

| | | | |
|---|---|---|---|
| 10,861,820 | B2 | 12/2020 | Bajwa |
| 11,205,633 | B2 | 12/2021 | Bajwa et al. |
| 11,515,286 | B2 | 11/2022 | Bajwa et al. |
| 2008/0078145 | A1 | 4/2008 | Tu et al. |
| 2009/0191338 | A1 | 7/2009 | Matsumoto et al. |
| 2011/0020544 | A1 | 1/2011 | Matsumoto |
| 2021/0265303 | A1 | 8/2021 | Bajwa et al. |

FOREIGN PATENT DOCUMENTS

| | | | | |
|---|---|---|---|---|
| KR | 10-2008-0113109 | | 12/2008 | |
| KR | 20110101265 | * | 9/2011 | ............ H01L 24/75 |
| KR | 10-2013-0036148 | | 4/2013 | |

OTHER PUBLICATIONS

International Search Report for PCT application No. PCT/US2023/028877 mailed Nov. 15, 2023.

* cited by examiner

*Primary Examiner* — Cory W Eskridge
(74) *Attorney, Agent, or Firm* — Christopher M. Spletzer, Sr.

(57)          ABSTRACT
A bonding system for bonding a semiconductor element to a substrate is provided. The bonding system includes a reducing gas delivery system configured to provide a reducing gas to a bonding area of a bonding system. The bonding system also includes a gas delivery line configured to transport the reducing gas from a reducing gas source to the reducing gas delivery system. At least a portion of the gas delivery line is heated.

29 Claims, 9 Drawing Sheets

STEP 700: DIRECT A REDUCING GAS FROM A REDUCING GAS SOURCE TO A BONDING AREA OF A BONDING SYSTEM USING A GAS DELIVERY LINE

STEP 702: HEAT THE REDUCING GAS SOURCE

STEP 704: HEAT AT LEAST A PORTION OF THE GAS DELIVERY LINE

STEP 706: DIRECT THE REDUCING GAS FROM THE REDUCING GAS SOURCE TO A SUBSTRATE OXIDE REDUCTION CHAMBER VIA AN ADDITIONAL GAS DELIVERY LINE, THE SUBSTRATE BEING RECEIVED BY THE SUBSTRATE OXIDE REDUCTION CHAMBER PRIOR TO STEP 710.

STEP 708: HEAT THE ADDITIONAL GAS DELIVERY LINE

STEP 710: BOND A SEMICONDUCTOR ELEMENT TO A SUBSTRATE AT THE BONDING AREA

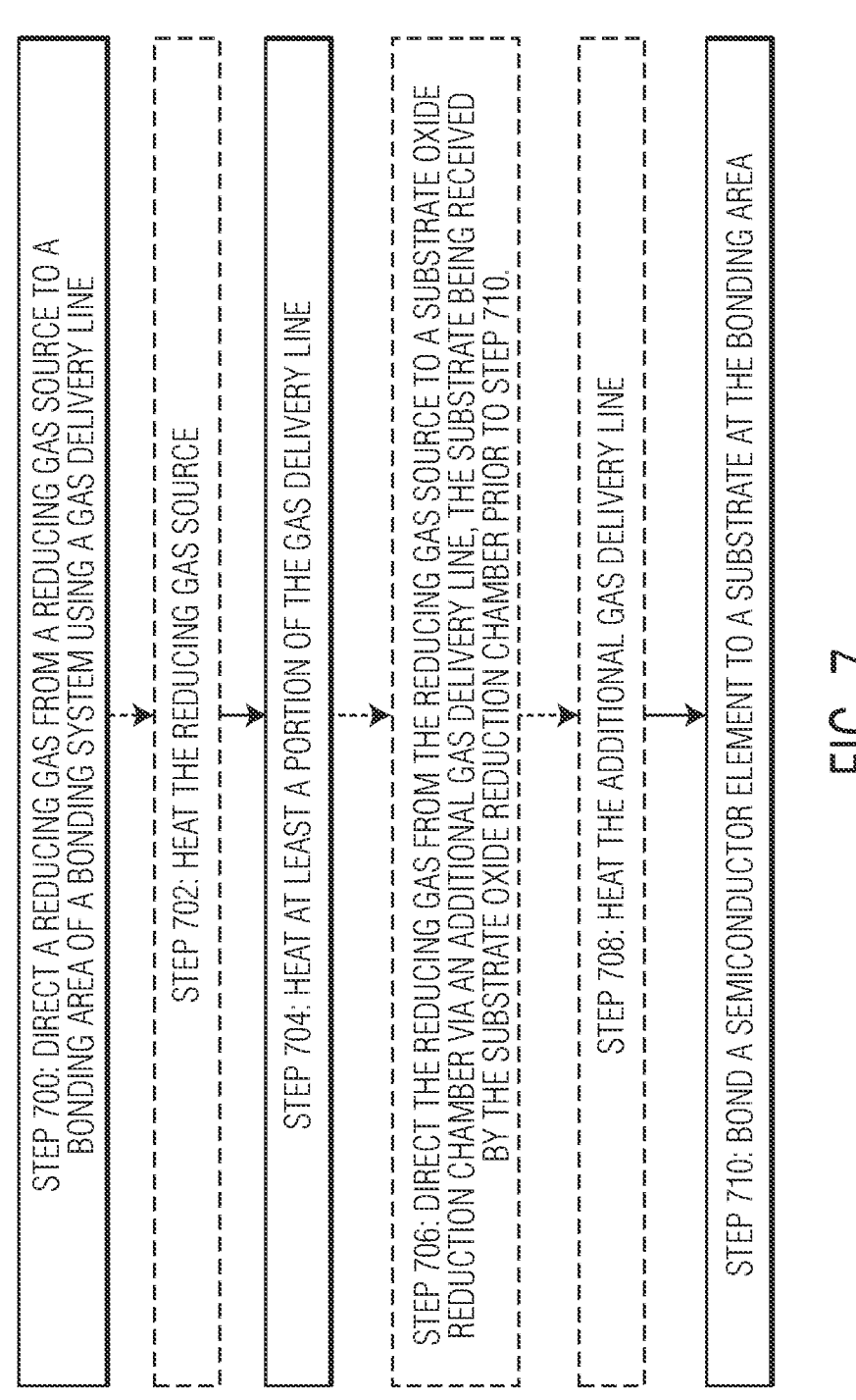

STEP 700: DIRECT A REDUCING GAS FROM A REDUCING GAS SOURCE TO A BONDING AREA OF A BONDING SYSTEM USING A GAS DELIVERY LINE.

STEP 702: HEAT THE REDUCING GAS SOURCE

STEP 704: HEAT AT LEAST A PORTION OF THE GAS DELIVERY LINE

STEP 706: DIRECT THE REDUCING GAS FROM THE REDUCING GAS SOURCE TO A SUBSTRATE OXIDE REDUCTION CHAMBER VIA AN ADDITIONAL GAS DELIVERY LINE, THE SUBSTRATE BEING RECEIVED BY THE SUBSTRATE OXIDE REDUCTION CHAMBER PRIOR TO STEP 710.

STEP 708: HEAT THE ADDITIONAL GAS DELIVERY LINE

STEP 710: BOND A SEMICONDUCTOR ELEMENT TO A SUBSTRATE AT THE BONDING AREA

FIG. 7

BONDING SYSTEMS FOR BONDING A SEMICONDUCTOR ELEMENT TO A SUBSTRATE, AND RELATED METHODS

CROSS REFERENCE TO RELATED APPLICATION

This application claims the benefit of U.S. Provisional Application No. 63/398,328, filed on Aug. 16, 2022, the content of which is incorporated herein by reference.

FIELD

The invention relates to bonding systems (such as flip chip and/or thermocompression bonding systems) and related bonding processes, and more particularly, to improved systems and methods for bonding a semiconductor element to a substrate including the use of a reducing gas.

BACKGROUND

Traditional semiconductor packaging typically involves die attach processes and wire bonding processes. Advanced semiconductor packaging technologies (e.g., flip chip bonding, thermocompression bonding, etc.) technologies continue to gain traction in the industry. For example, in thermocompression bonding (i.e., TCB), heat and/or pressure (and sometimes ultrasonic energy) are used to form a plurality of interconnections between (i) electrically conductive structures on a semiconductor element and (ii) electrically conductive structures on a substrate.

In certain flip chip bonding or thermocompression bonding applications, the electrically conductive structures of the semiconductor element and/or the substrate may include copper structures (e.g., copper pillars) or other material(s) that is subject to oxidation and/or other contamination. In such applications, it is desirable to provide an environment suitable for bonding. Conventionally, such an environment may be provided by using a reducing gas at the bonding area to reduce potential oxidation and/or contamination of the electrically conductive structures of the semiconductor element or the substrate to which it will be bonded.

It would be desirable to provide improved bonding systems for bonding such semiconductor elements to a substrate, and related methods.

SUMMARY

According to an exemplary embodiment of the invention, a bonding system for bonding a semiconductor element to a substrate is provided. The bonding system includes a reducing gas delivery system configured to provide a reducing gas to a bonding area of a bonding system. The bonding system also includes a gas delivery line configured to transport the reducing gas from a reducing gas source to the reducing gas delivery system. At least a portion of the gas delivery line is heated.

According to various exemplary embodiments of the invention, the bonding system of the immediately preceding paragraph may include any one or more of the following features: a portion of a manifold for distributing the reducing gas may also be heated with a heating element; the reducing gas is a formic acid vapor; the formic acid vapor has a concentration of 4-15% formic acid; a heating element for heating the gas delivery line; the gas delivery line is heated according to a heat profile; the heat profile is at least partially determined using a temperature of the reducing gas source;

the heat profile includes a temperature greater than the temperature of the reducing gas source; the temperature of the reducing gas source is 20° C.-70° C.; the reducing gas source is a bubbler type system; a substrate oxide prevention chamber configured to receive a substrate prior to bonding a semiconductor element to a substrate, the substrate oxide prevention chamber having an inert environment when receiving the substrate; a substrate oxide reduction chamber configured to receive the substrate prior to receipt of the substrate by the substrate oxide prevention chamber and configured to receive the reducing gas, and further comprising another reducing gas delivery system configured to provide the reducing gas to the substrate oxide reduction chamber; and an additional gas delivery line configured to transport the reducing gas from the reducing gas source to the substrate oxide reduction chamber, wherein at least a portion of the additional gas delivery line is heated.

According to another exemplary embodiment of the invention, a method of bonding a semiconductor element to a substrate is provided. The method includes: directing a reducing gas from a reducing gas source to a bonding area of a bonding system using a gas delivery line; heating at least a portion of the gas delivery line; and bonding a semiconductor element to a substrate at the bonding area.

According to various exemplary embodiments of the invention, the method of the immediately preceding paragraph may include any one or more of the following features: a portion of a manifold for distributing the reducing gas may also be heated with a heating element; the directing step includes delivering the reducing gas to the bonding area via a reducing gas delivery system; the reducing gas is a formic acid vapor; the formic acid vapor has a concentration of 4-15% formic acid; the heating step includes heating the gas delivery line (e.g., using a heating element) according to a heat profile; the gas delivery line is heated according to a heat profile; the heat profile is at least partially determined using a temperature of the reducing gas source; the heat profile includes a temperature greater than the temperature of the reducing gas source; the temperature of the reducing gas source is 20° C.-70° C.; the reducing gas source is a bubbler type system; further comprising the step of heating the reducing gas source; further comprising step of directing the reducing gas from the reducing gas source to a substrate oxide reduction chamber via an additional gas delivery line, the substrate being received by the substrate oxide reduction chamber prior to the bonding step; and heating the additional gas delivery line.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 7 is a flow diagram illustrating a method of bonding a semiconductor element to a substrate on a bonding system in accordance with various exemplary embodiments of the invention.

DETAILED DESCRIPTION

Figure 1:
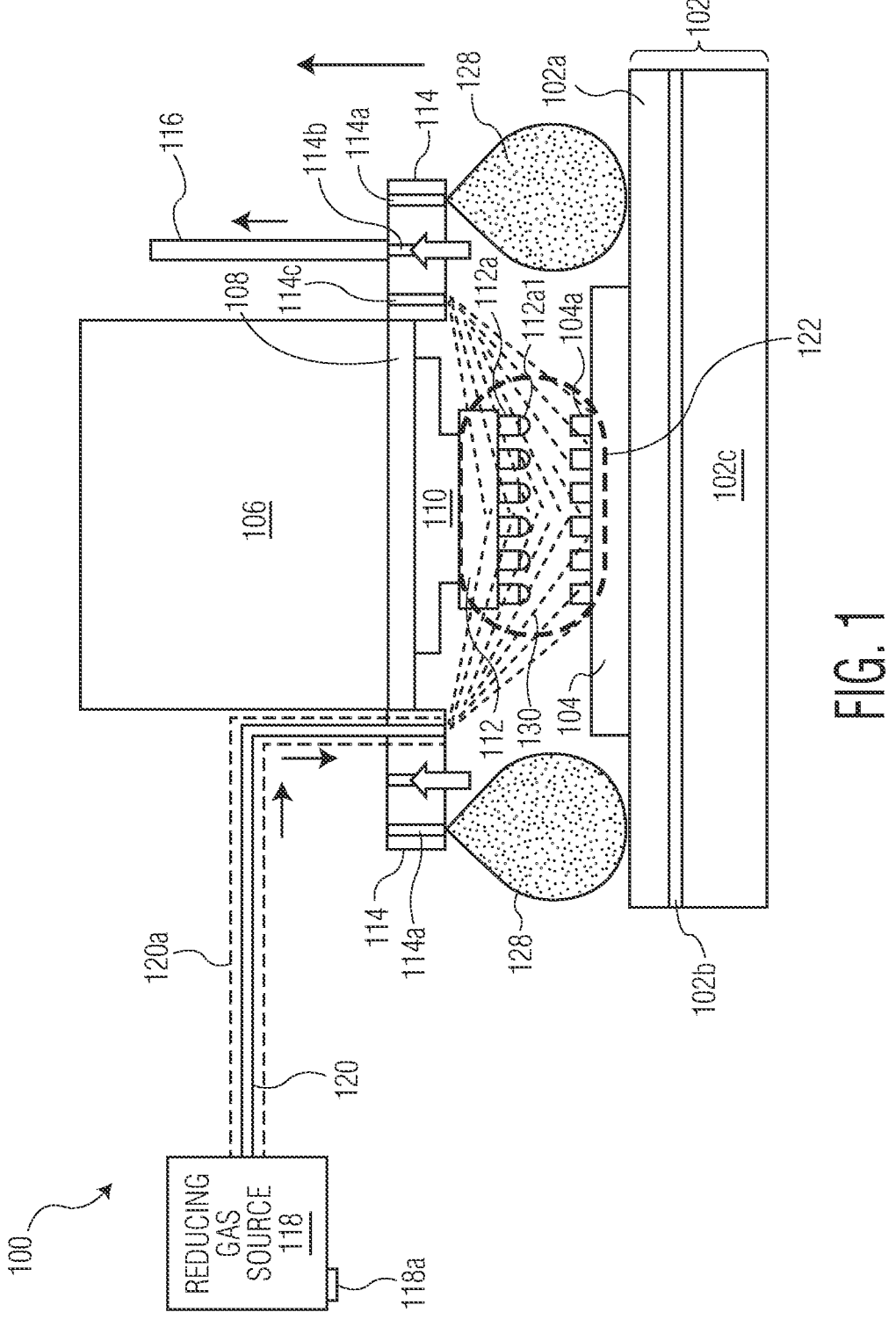
FIGS. 1-4 are block diagram side views illustrating bonding systems configured to provide reducing gas to a bonding area in accordance with various exemplary embodiments of the invention.

Aspects of the invention relate to supplying a reducing gas (e.g., formic acid in a carrier gas, such as nitrogen) from a reducing gas source (e.g., a formic acid vapor source such as a bubbler) to a predetermined area of a bonding system (e.g., a bonding area of a thermocompression bonder). According to certain aspects of the invention, it is desirable to reduce the potential for (and possibly prevent) condensation of a reducing gas (e.g., a formic acid vapor including a carrier gas) by increasing a temperature of a delivery line above a dew point of a reducing gas (e.g., formic acid vapor). It may also be desirable to provide a higher concentration of an acid in the reducing gas (e.g., a higher concentration of formic acid in a formic acid vapor). For example, according to certain exemplary embodiments of the invention, a reducing gas may include 4-15% formic acid. Such a reducing gas may be provided to a reducing gas delivery system (e.g., a bondhead shroud of a bonding system) and/or another area of the bonding system (e.g., substrate oxide reduction chamber). This reducing gas can be used to create a localized reducing environment around the semiconductor element and the substrate. Utilizing a high acid concentration reducing gas tends to help in the removal of oxides from the surface of electrically conductive structures of the semiconductor element and/or substrate (e.g., copper, silver, indium, solder, tin silver solder, etc.). Using such a high acid concentration reducing gas also tends to reduce the injection time of the reducing gas. As a result, an overall improvement of the UPH (units per hour) of a bonding process (e.g., a flip chip bonding process, a thermocompression bonding process, etc.) is provided.

Each of U.S. Pat. No. 10,861,820 (entitled "METHODS OF BONDING SEMICONDUCTOR ELEMENTS TO A SUBSTRATE, INCLUDING USE OF A REDUCING GAS, AND RELATED BONDING MACHINES"), U.S. Pat. No. 11,205,633 (entitled "METHODS OF BONDING SEMICONDUCTOR ELEMENTS TO SUBSTRATES, AND RELATED BONDING SYSTEMS"), and U.S. Pat. No. 11,515,286 (entitled "METHODS OF BONDING SEMICONDUCTOR ELEMENTS TO SUBSTRATES, AND RELATED BONDING SYSTEMS"), relate to bonding systems utilizing a reducing gas, and are hereby incorporated herein by reference in their entirety.

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the term "substrate" is intended to refer to any structure to which a semiconductor element may be bonded. Exemplary substrates include, for example, a leadframe, a PCB, a carrier, a module, a semiconductor chip, a semiconductor wafer, a BGA substrate, another semiconductor element, etc.

Referring now to the drawings, FIG. 1 illustrates a bonding system 100 (e.g., a flip chip bonding machine, a thermocompression bonding machine, etc.). Bonding system 100 includes a support structure 102 for supporting a substrate 104 during a bonding operation (where substrate 104 includes a plurality of electrically conductive structures 104a). Support structure 102 may include any appropriate structure for the specific application. In the illustrated embodiment, support structure 102 includes a top plate 102a (configured to directly support substrate 104), a chuck 102c, and a heater 102b disposed therebetween.

Bonding system 100 also includes a bond head assembly 106, which may be configured to move along (and about) a plurality of axes of bonding system 100 such as, for example, the x-axis, y-axis, z-axis, theta (rotative) axis, etc. Bond head assembly 106 includes and/or carries a heater 108 and a bonding tool 110. In certain bonding machines (e.g., thermocompression bonding machines) it may be desirable to heat bonding tool 110. While FIG. 1 illustrates a separate heater 108 for heating bonding tool 110 (for heating a semiconductor element 112 including a plurality of electrically conductive structures 112a), it will be appreciated that heater 108 and bonding tool 110 may be integrated into a single element (e.g., a heated bonding tool).

In connection with a bonding operation, semiconductor element 112 is bonded to substrate 104 using bonding tool 110. During the bonding operation, corresponding ones of electrically conductive structures 112a are bonded (e.g., using heat, force, ultrasonic energy, etc.) to respective ones of electrically conductive structures 104a. In the example shown in FIG. 1, electrically conductive structures 112a include a solder material 112a1 at a contact portion of each electrically conductive structure 112a (e.g., a portion configured to contact the electrically conductive structures 104a of substrate 104). It will be appreciated that this is an example—and that electrically conductive structures of any semiconductor element and/or substrate illustrated herein (or otherwise within the scope of the invention) may or may not include such solder material.

In certain bonding applications (e.g., thermocompression bonding, flip chip bonding, etc.), it is desirable to provide an environment suitable for bonding. Conventionally, such an environment may be provided by using a reducing gas at the bonding area to reduce potential oxides of the electrically conductive structures of the semiconductor element and/or the substrate to which it will be bonded. The reducing gas is delivered to the bonding area by a reducing gas delivery system. Such a reducing gas delivery system may be any means for distributing reducing gas to a bonding area. Herein, the reducing gas delivery system is illustrated and described as a manifold configured to receive and distribute fluids to the bonding area. However, the invention is not limited thereto. It is contemplated that a reducing gas delivery system may include any appropriate structure such as a pipe/tube opening, a nozzle, a sprayer, etc.

In FIG. 1, bond head assembly 106 carries a bond head manifold 114 that serves as the reducing gas delivery system. While bond head manifold 114 is illustrated in a cross-sectional view, the actual bond head manifold 114 surrounds bonding tool 110 (e.g., bond head manifold 114 surrounds bonding tool 110 in a coaxial configuration). Of course, bond head manifold 114 may have different configurations from that illustrated in FIG. 1. Further, it is understood that certain details of bond head manifold 114 are omitted for simplicity.

Bond head manifold 114 includes three channels 114a, 114b, 114c having different functions. An outer channel 114a receives a shielding gas (e.g., nitrogen gas) from a shielding gas supply (not illustrated). From outer channel 114a of bond head manifold 114, a shielding gas 128 is provided to shield a bonding area 122 from the outside environment. An inner channel 114c receives a reducing gas 130 (e.g., where reducing gas 130 may be a saturated vapor gas such as formic acid vapor, a reducing gas including excess reducing species, etc.) via a gas delivery line 120, and provides reducing gas 130 to bonding area 122 (e.g., where bonding area 122 is a location where semiconductor element 112 is bonded to substrate 104).

Reducing gas 130 is provided from a reducing gas source 118 (via gas delivery line 120). For example, reducing gas source 118 may be a bubbler type system including (i) an acid fluid like formic acid, acetic acid, or another acidic fluid (where the bubbler type system may be part of bonding system 100) and (ii) a carrier gas (e.g., nitrogen). In another example, reducing gas source 118 may be a vessel (e.g., a pressurized vessel such as a tank) or another source for directing reducing gas 130 to bonding system 100. Reducing gas source 118 may be heated to facilitate a higher vapor gas saturation point (e.g., a formic acid vapor concentration of 4-15%). Reducing gas source 118 may be heated, for example, to a range of 20° C.-70° C., or a range of 40° C.-50° C., etc. Reducing gas 130 (e.g., formic acid vapor including a carrier gas such as nitrogen) is transported from reducing gas source 118 to bond head manifold 114 via gas delivery line 120. Gas delivery line 120 is a structure (e.g., a conduit, a pipe, a hose, etc.) configured to carry reducing gas 130, and may include multiple branches.

Reducing gas 130 may be more effective (e.g., at providing a desirable environment for bonding) when heated if a higher concentration of acid in the reducing gas is provided; however, it is desirable to avoid condensation resulting from a temperature differential between (i) the reducing gas at the reducing gas source and (ii) the reducing gas in gas delivery line 120. FIG. 1 illustrates a heating element 120a surrounding gas delivery line 120. Heating element 120a provides heat (e.g., by conduction, convection, radiation, or any other heating method) to gas delivery line 120 (and if desired, to the portion of manifold 114 receiving the reducing gas). The heat may be provided to gas delivery line 120 according to a heat profile. As used herein, the term "heat profile" is intended to be broadly defined as any type of heating process for heating at least a portion of a gas delivery line.

Aspects of various exemplary "heat profiles" are now described. For example, a heat profile may be simply heating the appropriate portion of the gas delivery line to a fixed setpoint. In another example, a heat profile may include a time based heating process (e.g., where the heat setpoint varies in time) (e.g., having a first temperature setpoint prior to bonding, and a different temperature setpoint during bonding). In yet another example, the heat profile may include a heating process provided in consideration of reducing gas flow rates. In yet another example, the heat profile may utilize different setpoints depending on a location along a gas delivery line (e.g., where a gas delivery line may include a plurality of branches, and wherein the branches may have different temperature setpoints).

In yet another example, the heat profile is at least partially determined using a temperature of the reducing gas source (e.g., a setpoint temperature value, a measured temperature value, a temperature range, a temperature profile, etc.). As used herein, the temperature of the reducing gas source may be a temperature of a liquid at the reducing gas source (e.g., formic acid liquid), a temperature of a gas at the reducing gas source (e.g., formic acid vapor including a carrier gas), a temperature of a structure of the reducing gas source, etc. Certain of the drawings provided herein illustrate a temperature sensor 118a for providing the temperature of the reducing gas source, if such a temperature is desired to be used.

In a more specific example, the heat profile may include a temperature target (e.g., a specific temperature value, a range of temperatures, etc.). The temperature target may be based on another temperature (e.g., greater than a reducing gas source temperature, the temperature required for a particular concentration of formic acid vapor in nitrogen, etc.).

In another more specific example, the heat profile may be controlled by a closed loop system including a controller (e.g., a sensor measuring a gas delivery line temperature and a controller configured to reach a temperature set point, not shown for simplicity). In another example, the heat profile may include a parameter other than temperature (e.g., heat flow based on reducing gas flow rate, on/off time, etc.).

The above exemplary aspects of heat profiles are not mutually exclusive; that is, a heat profile may combine more than one of these aspects. Thus, as should be understood by those skilled in the art, the term "heat profile" is not limited to any specific process of heating a gas delivery line. As will be further understood by those skilled in the art, the explanation related to the heating element and/or the heat profile provided with respect to FIG. 1 may be applicable to the corresponding heating element of the other embodiments of the invention illustrated and described herein (e.g., FIGS. 2-4, 5A-5B, and 6A-6B), and other embodiments within the scope of the invention.

Although FIG. 1 illustrates heating element 120a surrounding the full length of gas delivery line 120 (and also the portion of manifold 114 receiving the reducing gas), the invention is not limited thereto. As one skilled in the art would recognize, gas delivery line 120 could be heated by other arrangements, including a heater placed near gas delivery line, under the gas delivery line, in the gas delivery line, or otherwise near the gas delivery line to achieve the same effect. Further, it is contemplated that heating element 120a could achieve its purpose by surrounding only a portion of the length of gas delivery line 120. The variations described in this paragraph (e.g., the heating may be of the entire gas delivery line, or a portion of the gas delivery line, etc.) is applicable to all other embodiments of the invention (not just those shown in FIG. 1).

After reducing gas 130 is distributed in bonding area 122, reducing gas 130 contacts surfaces of each of electrically conductive structures 104a (of substrate 104) and electrically conductive structures 112a (of semiconductor element 112). The surfaces of electrically conductive structures 104a/112a may then include a reaction product (e.g., where the reaction product is provided as a result of (i) a surface oxide on electrically conductive structures 104a/112a, and (ii) reducing gas 130 (and possibly heat provided by heater 108 and transferred to electrically conductive structures 104a via contact with electrically conductive structures 112a, if desired). This reaction product is desirably removed from bonding area 122 using vacuum provided through a center channel 114b of bond head manifold 114 via exit piping 116.

Figure 2:
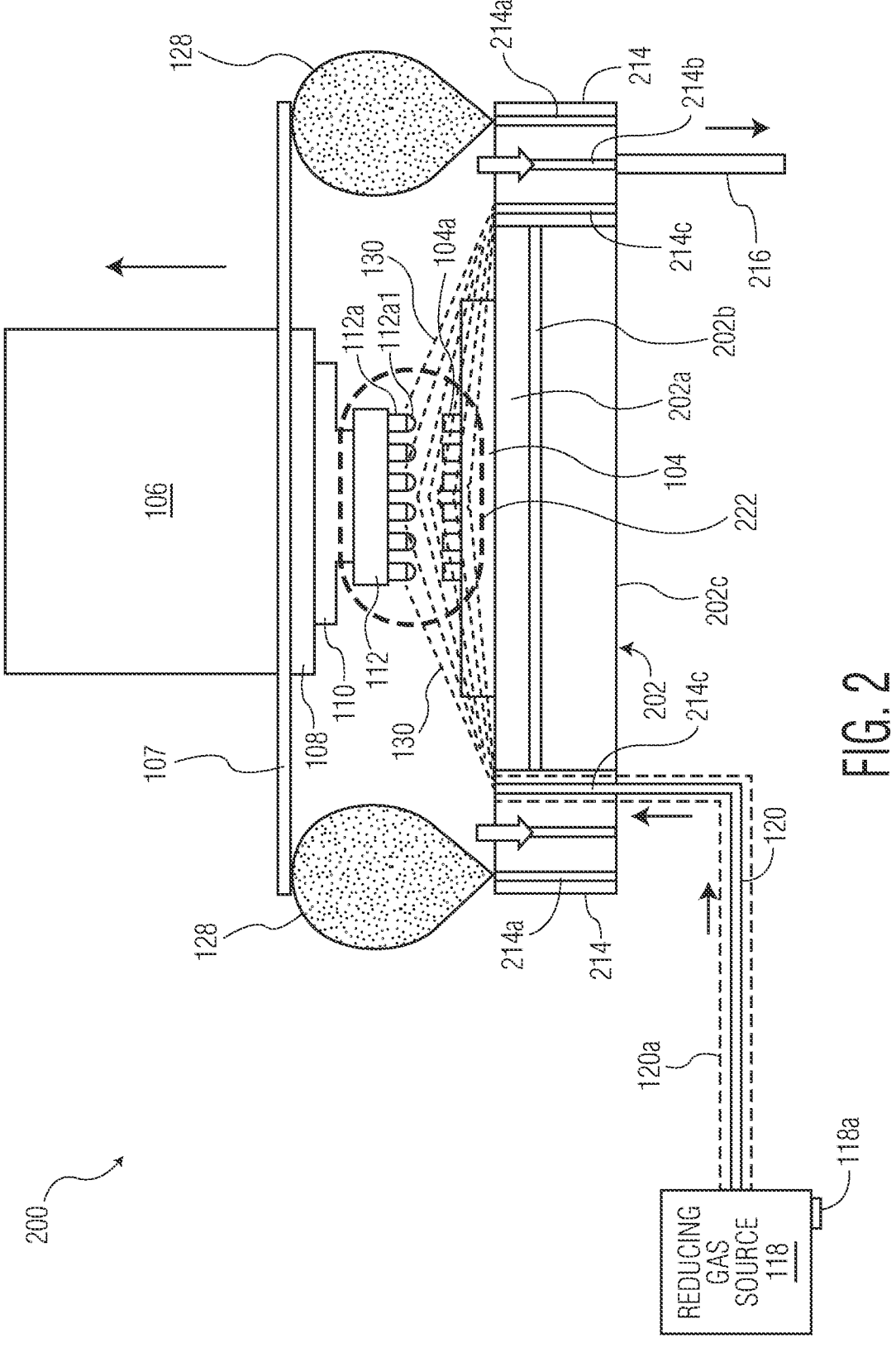

Referring now to FIG. 2, a bonding system 200 is illustrated. Bonding system 200 is similar in many ways to bonding system 100, where like elements have the same reference numeral or a numeral beginning with a "2" instead of a "1" (unless explicitly indicated otherwise). Bonding system 200 includes a support structure 202 for supporting a substrate 104. Support structure 202 includes a top plate 202a (configured to directly support substrate 104), a chuck 202c, and a heater 202b disposed therebetween.

Bonding system 200 also includes a bond head assembly 106 (including a heater 108 and a bonding tool 110), which may be configured to move along (and about) a plurality of axes of bonding system 200 such as, for example, the x-axis, y-axis, z-axis, theta (rotative) axis, etc. Bond head assembly 106 includes and/or carries a heater 108 and a bonding tool 110. Bonding tool 110 is illustrated carrying a semiconductor element 112 (including a plurality of electrically conductive structures 112a and solder material 112a1). Bond head assembly 106 is illustrated carrying a plate 107 for partially containing at least one of a shielding gas 128 and a reducing gas 130.

As opposed to a bond head manifold 114 carried by bond head assembly 106 (as in FIG. 1), FIG. 2 illustrates another manifold 214 carried by, and/or integrated with, support structure 202. Manifold 214 serves as the reducing gas delivery system. While manifold 214 is illustrated in a cross-sectional view, the actual manifold 214 at least partially surrounds substrate 104. Of course, manifold 214 may have different configurations from that illustrated in FIG. 2. Further, it is understood that certain details of manifold 214 (e.g., interconnection details with a gas delivery line 120, structural details for distributing reducing gas 130 within manifold 214, structural details for distributing shielding gas 128 within manifold 214, structural details for drawing a vacuum through a center channel 214b of manifold 214, etc.) are omitted for simplicity.

Manifold 214 includes three channels 214a, 214b, 214c having different functions. An outer channel 214a receives shielding gas 128 (e.g., nitrogen gas) from shielding gas supply (e.g., a nitrogen tank, a gas supply, etc.). From outer channel 214a of manifold 214, shielding gas 128 is provided to shield a bonding area 222 from the outside environment. An inner channel 214c receives reducing gas 130 via gas delivery line 120 and provides reducing gas 130 to bonding area 222 in connection with a bonding operation. Reducing gas 130 is provided from reducing gas source 118 and is carried by a gas delivery line 120.

Gas delivery line 120 is configured for carrying reducing gas 130 from reducing gas source 118 to bonding area 222 of bonding system 200, where reducing gas 130 is configured for use during bonding of semiconductor element 112 to substrate 104 at bonding area 222. In the embodiment illustrated in FIG. 2, gas delivery line 120 is configured to provide reducing gas 130 to support structure 202 (e.g., via manifold 214). A heating element 120a is provided for increasing the temperature of gas delivery line 120 (and if desired, the portion of manifold 214 receiving the reducing gas), and in turn, the reducing gas 130 flowing through gas delivery line 120 prior to reducing gas 130 reaching the bonding area.

After reducing gas 130 is distributed in the area of semiconductor element 112 and substrate 104, reducing gas 130 contacts surfaces of each of electrically conductive structures 104a and electrically conductive structures 112a. The surfaces of electrically conductive structures 104a/112a may then include a reaction product (e.g., where the reaction product is provided as a result of: (i) a surface oxide on electrically conductive structures 104a/112a, and (ii) reducing gas from reducing gas 130 (and possibly heat provided by heater 108, if desired). This reaction product is desirably removed from the bonding area (i.e., the area where electrically conductive structures 112a of semiconductor element 112 are bonded to corresponding electrically conductive structures 104a of substrate 104) using vacuum provided through center channel 214b of manifold 214 via an exit piping 216.

Figure 3:
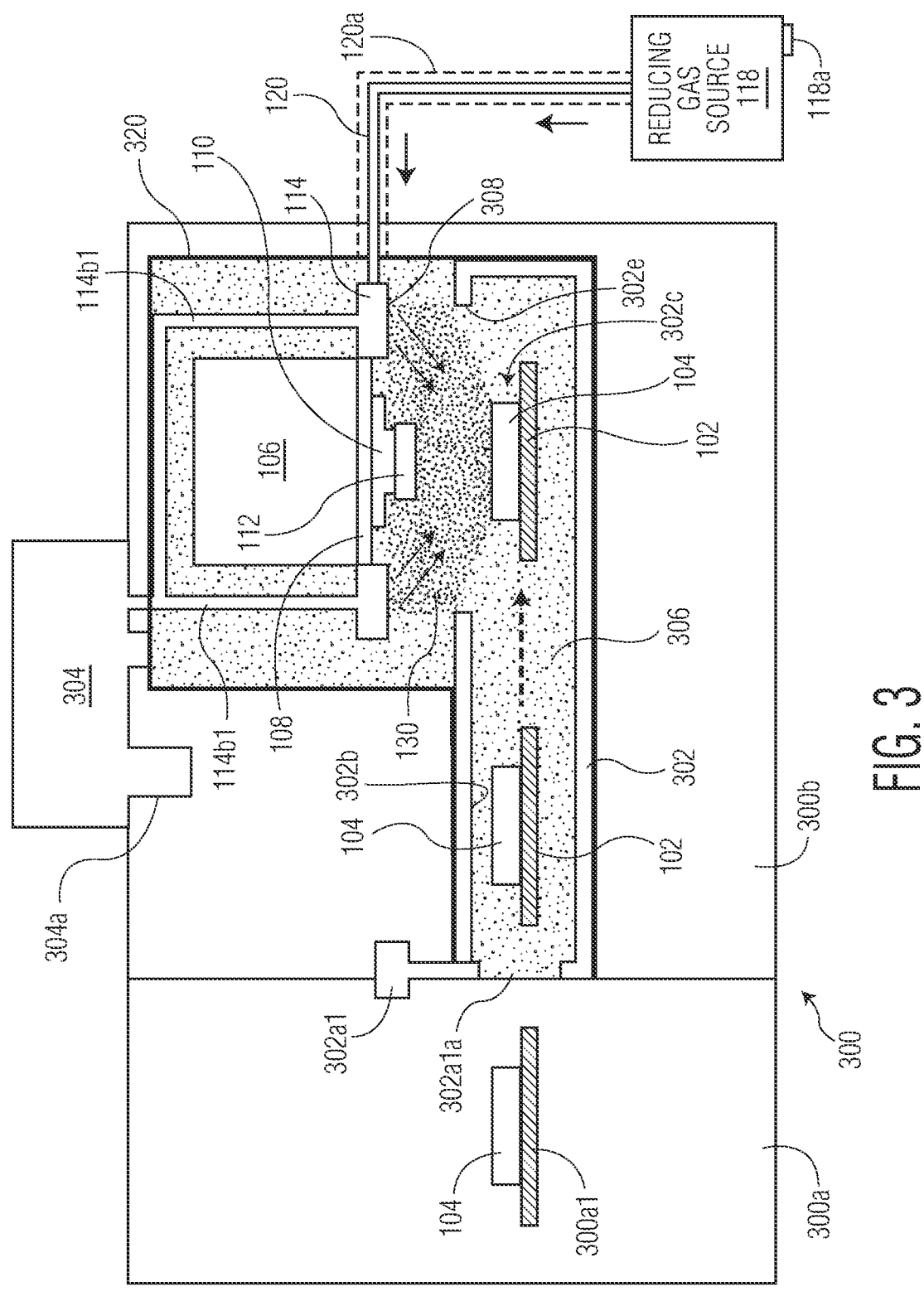

Referring now to FIG. 3, a bonding system 300 is illustrated. Bonding system 300 is similar in many ways to bonding system 100 of FIG. 1, where like elements have the same reference numerals, or a numeral beginning with a "3" instead of a "1" (unless explicitly indicated otherwise). Bonding system 300 includes: a substrate source 300a (e.g., a wafer handler or other source) for providing a substrate 104 (such as a wafer, a printed circuit board, etc.) on a support structure 300a1; and a processing system 300b. Substrate 104 is configured to be transferred to processing system 300b (e.g., including an inner environment chamber 320, including a tunnel 302). Tunnel 302 includes a substrate oxide prevention chamber 302b and a bonding location 302c (which is part of substrate oxide prevention chamber 302b). A reducing gas delivery system 308 (including bond head manifold 114) is also included in processing system 300b. Within processing system 300b (sometimes referred to as main machine compartment), inner environment chamber 320 may include at least a portion of substrate oxide prevention chamber 302b and reducing gas delivery system 308.

Bonding system 300 also includes a bond head assembly 106, including a heater 108, and a bonding tool 110. Details of an exemplary bond head assembly 106 are described in connection with FIG. 1. FIG. 3 also illustrates a main exhaust 304 which pulls exhaust gases (e.g., gases such as reducing gas vapors) from the processing system 300b or the inner environment chamber 320 through piping 304a and piping 114b1 (where piping 114b1 is coupled, directly or indirectly, to center channel 114b described in FIG. 1). Bond head assembly 106 carries a bond head manifold 114 that serves as the reducing gas delivery system. Bond head manifold 114 receives a reducing gas 130 from a reducing gas source 118 via a gas delivery line 120.

In the example illustrated in FIG. 3, tunnel 302 includes an entry door 302a1 (which closes an opening 302a1a). A substrate transfer system (which may be part of a material handling system, including a support structure 102) is used to transfer a substrate 104 through entry door 302a1 to substrate oxide prevention chamber 302b. Substrate oxide prevention chamber 302b includes an inert environment 306 (e.g., through a nitrogen supply, not illustrated for simplicity). A material handling system is used to move substrate 104 within substrate oxide prevention chamber 302b to a bonding location 302c. While at bonding location 302c, a reducing gas 130 is provided by reducing gas delivery system 308. Reducing gas 130 is provided from a reducing gas source 118 and is carried by a gas delivery line 120.

Gas delivery line 120 is configured for carrying reducing gas 130 from reducing gas source 118 to a bonding area (e.g., including bonding location 302c) of bonding system 300, where reducing gas 130 is configured for use during bonding of a semiconductor element 112 to substrate 104 at the bonding area. In the embodiment illustrated in FIG. 3, gas delivery line 120 is configured to provide reducing gas 130 to bond head assembly 106 and/or bond head manifold 114. A heating element 120a is provided for increasing the temperature of gas delivery line 120, and in turn, the reducing gas 130 flowing through gas delivery line 120 prior to reducing gas 130 reaching the bonding area.

In connection with a bonding operation, semiconductor element 112 (which is carried by bond head assembly 106 into tunnel 302 through an opening 302*e*) is bonded to substrate 104 using bonding tool 110. During the bonding operation, corresponding ones of electrically conductive structures of semiconductor element 112 are bonded (e.g., using heat, force, ultrasonic energy, etc.) to respective ones of electrically conductive structures of substrate 104. Bond head manifold 114 provides a reducing gas 130 (e.g., where the reducing gas may be a saturated vapor gas such as formic acid vapor) in the area of semiconductor element 112 and substrate 104 in connection with a bonding operation (in the illustrated example, reducing gas 130 is able to enter tunnel 302 through opening 302*e*). After reducing gas 130 is distributed in the area of semiconductor element 112 and substrate 104, reducing gas 130 contacts surfaces of each of electrically conductive structures of semiconductor element 112 and substrate 104.

Figure 4:
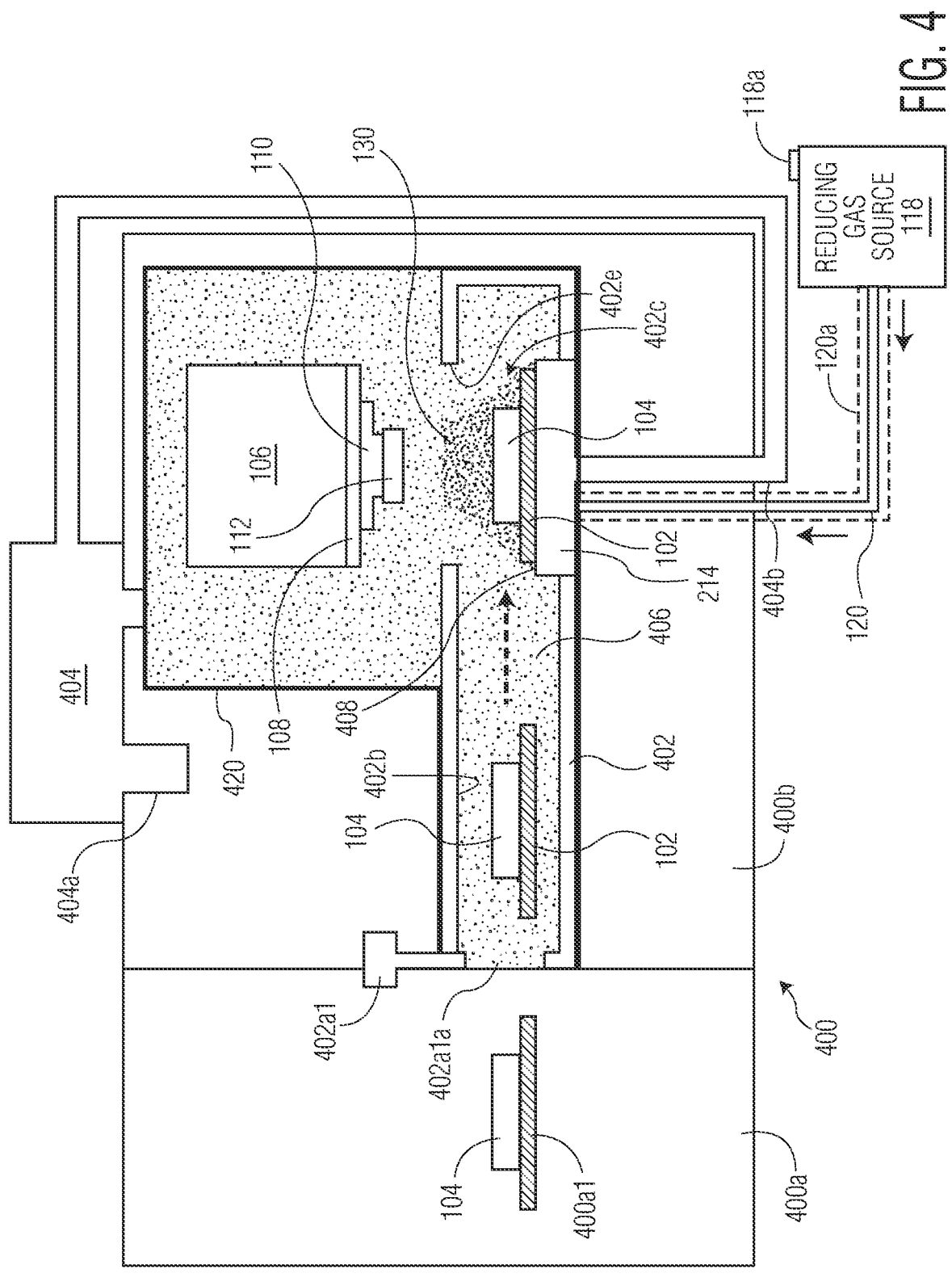

Referring now to FIG. 4, a bonding system 400 is illustrated. Bonding system 400 is similar in many ways to bonding system 200 of FIG. 2 and bonding system 300 of FIG. 3, where like elements have the same reference numerals, or a numeral beginning with a "4" instead of a "1", "2", or "3" (unless explicitly indicated otherwise). Bonding system 400 is essentially bonding system 300, but with manifold 214 of FIG. 2 (and associated structures) in lieu of bond head manifold 114 (and associated structures) of FIG. 1.

Bonding system 400 includes a main exhaust 404 which pulls exhaust gases (e.g., gases such as reducing gas vapors) through piping 404*a* and 404*b*. A processing system 400*b* is similar to processing system 300*b*, except processing system 400*b* includes a reducing gas delivery system 408 (including a manifold 214) in lieu of reducing gas delivery system 308 (including bond head manifold 114). Manifold 214 is provided for receiving and distributing fluids (e.g., gases, vapors, etc.) as desired in the given application. Manifold 214 receives a reducing gas 130 from a reducing gas source 118 via a gas delivery line 120.

Gas delivery line 120 is configured for carrying reducing gas 130 from reducing gas source 118 to a bonding area (e.g., including bonding location 402*c*) of bonding system 400, where reducing gas 130 is configured for use during bonding of a semiconductor element 112 to a substrate 104 at the bonding area. In the embodiment illustrated in FIG. 4, gas delivery line 120 is configured to provide reducing gas 130 to support structure 102 (e.g., via manifold 214). A heating element 120*a* is provided for increasing the temperature of gas delivery line 120, and in turn, the reducing gas 130 flowing through gas delivery line 120 prior to reducing gas 130 reaching the bonding area.

Figure 5A:
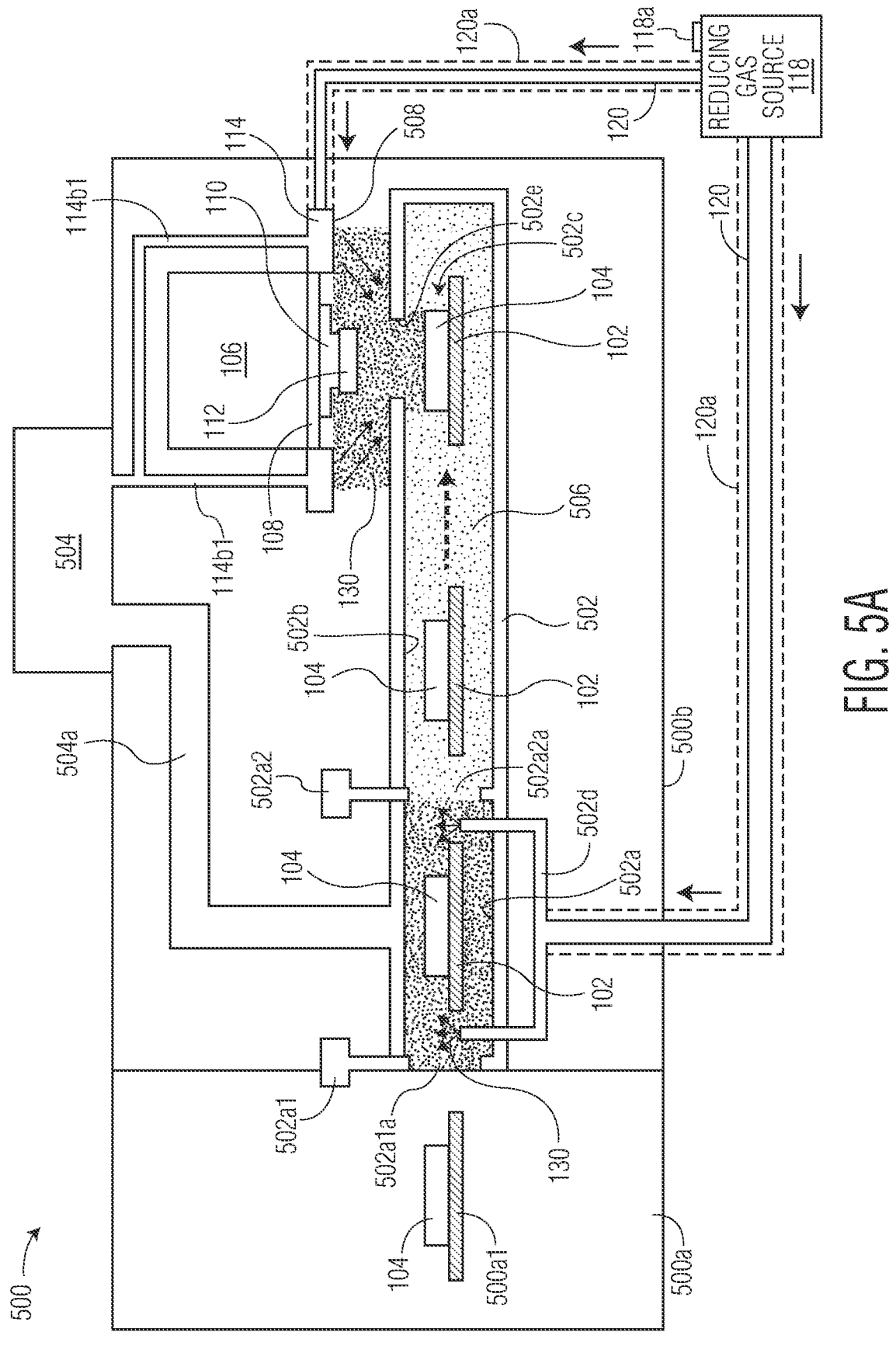
FIGS. 5A-5B and 6A-6B are block diagram side views illustrating bonding systems configured to provide reducing gas to a bonding area, and to a substrate oxide reduction chamber, in accordance with various exemplary embodiments of the invention.

Referring now to FIG. 5A, a bonding system 500 is illustrated. Bonding system 500 includes: a substrate source 500*a* (e.g., a wafer handler or other source) for providing a substrate(s) 104 (such as a wafer, a printed circuit board, etc.) on a support structure 500*a*1; and a processing system 500*b*. Substrate 104 is configured to be transferred to processing system 500*b* (e.g., including a tunnel 502). Tunnel 502 includes a substrate oxide reduction chamber 502*a*, a substrate oxide prevention chamber 502*b*, and a bonding location 502*c* (which is part of substrate oxide prevention chamber 502*b*). A reducing gas delivery system 508 (including bond head manifold 114, described below) is also included in processing system 500*b*.

In the example shown in FIG. 5A, at least a portion of substrate oxide reduction chamber 502*a* has a common boundary with substrate oxide prevention chamber 502*b* because tunnel 502 includes both substrate oxide reduction chamber 502*a* and a substrate oxide prevention chamber 502*b*. Substrate oxide reduction chamber 502*a* is closed using an entry door 502*a*1 (which closes an opening 502*a*1*a*) and an exit door 502*a*2 (which closes an opening 502*a*2*a*). Another reducing gas delivery system 502*d* provides a reducing gas 130 (e.g., formic acid vapor) to substrate oxide reduction chamber 502*a*. In the example shown in FIG. 5A, reducing gas delivery system 508 and reducing gas delivery system 502*d* receive reducing gas from reducing gas source 118.

After processing (e.g., removal of oxides from conductive structures of a substrate 104) in substrate oxide reduction chamber 502*a*, a substrate transfer system (which may be part of a material handling system including a support structure 102) is used to transfer substrate 104 through exit door 502*a*2 to substrate oxide prevention chamber 502*b*. Substrate oxide prevention chamber 502*b* includes an inert environment 506 (e.g., through a nitrogen supply, not shown for simplicity). A material handling system (e.g., including support structure 102) is used to move substrate 104 within substrate oxide prevention chamber 502*b* to a bonding location 502*c*. While at bonding location 502*c*, a reducing gas 130 is provided by reducing gas delivery system 508.

Bonding system 500 also includes a bond head assembly 106, including a heater 108, and a bonding tool 110 (see FIG. 1 for a more detailed description of bond head assembly 106). FIG. 5A also illustrates a main exhaust 504 which pulls exhaust gases (e.g., gases such as reducing gas vapors) through piping 504*a* and 114*b*1 (where piping 114*b*1 is coupled, directly or indirectly, to center channel 114*b* described in FIG. 1). Bond head assembly 106 carries a bond head manifold 114 for receiving and distributing fluids (e.g., gases, vapors, etc.) as desired in the given application.

Gas delivery line 120 is configured for carrying reducing gas 130 from reducing gas source 118 to (i) reducing gas delivery system 508 (and/or bond head manifold 114) and (ii) reducing gas delivery system 502*d*. Thus, gas delivery line 120 carries reducing gas 130 from reducing gas source 118 to a bonding area (e.g., including bonding location 502*c*) via reducing gas delivery system 508. Reducing gas 130 is configured for use during bonding (e.g., thermocompression bonding, flip chip bonding, etc.) of a semiconductor element 112 to a substrate 104. In the embodiment illustrated in FIG. 5A (and FIG. 5B), gas delivery line 120 is also configured to carry reducing gas 130 to substrate oxide reduction chamber 502*a* via reducing gas delivery system 502*d*. Substrate oxide reduction chamber 502*a* is configured to receive substrate 104 prior to bonding of semiconductor element 112 to the substrate 104.

A heating element 120*a* is provided for increasing the temperature of gas delivery line 120, and in turn, the reducing gas 130 flowing through gas delivery line 120 prior to reducing gas 130 reaching the bonding area.

In connection with a bonding operation, semiconductor element 112 (which is carried by bond head assembly 106 into tunnel 502 through an opening 502*e*) is bonded to substrate 104 using bonding tool 110. During the bonding operation, corresponding ones of electrically conductive structures of semiconductor element 112 are bonded (e.g., using heat, force, ultrasonic energy, etc.) to respective ones of electrically conductive structures of substrate 104. Bond head manifold 114 provides a reducing gas 130 (e.g., where the reducing gas is a saturated vapor gas) in the area of semiconductor element 112 and substrate 104 in connection with a bonding operation (in the illustrated example, reducing gas 130 is able to enter tunnel 502 through opening 502e). After reducing gas 130 is distributed in the area of semiconductor element 112 and substrate 104, reducing gas 130 contacts surfaces of each of electrically conductive structures of semiconductor element 112 and substrate 104.

Figure 5B:
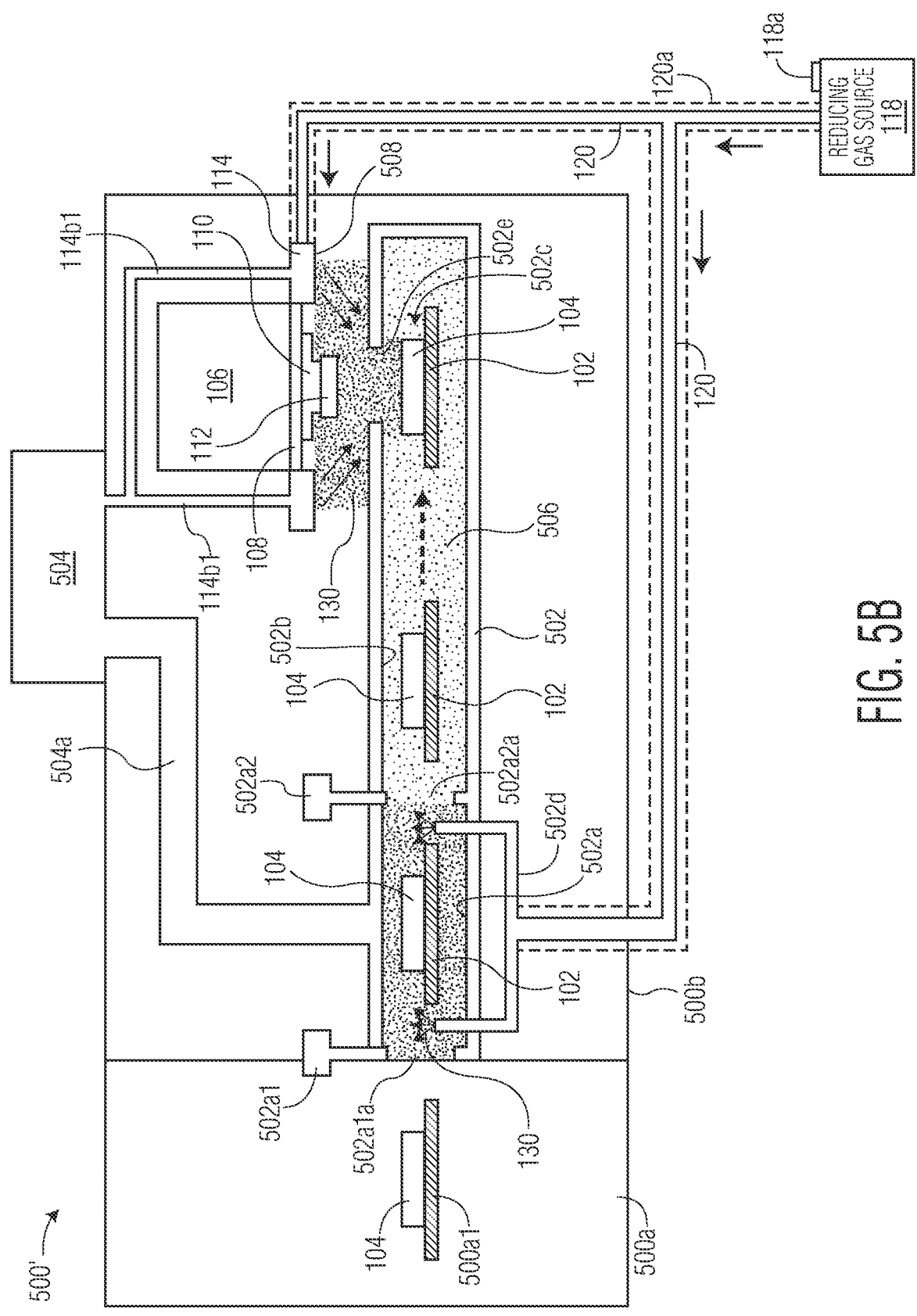

FIG. 5B illustrates a bonding system 500'. Bonding system 500' is the same as bonding system 500, except bonding system 500 illustrates multiple branches of gas delivery line 120 (and a plurality of heating elements 120a) extending from reducing gas source 118, whereas bonding system 500' illustrates a single gas delivery line 120 (and a single heating element 120a) extending from reducing gas course 118 and then branching off into two portions of gas delivery line 120 (i.e., one branch of gas delivery line 120 extending to substrate oxide reduction chamber 502a, and the other branch of gas delivery line 120 connecting to manifold 214). Thus, while being carried from reducing gas source 118, reducing gas 130 passes through a single heating element 120a in bonding system 500' and through a plurality of heating elements 120a in bonding system 500.

Figure 6A:
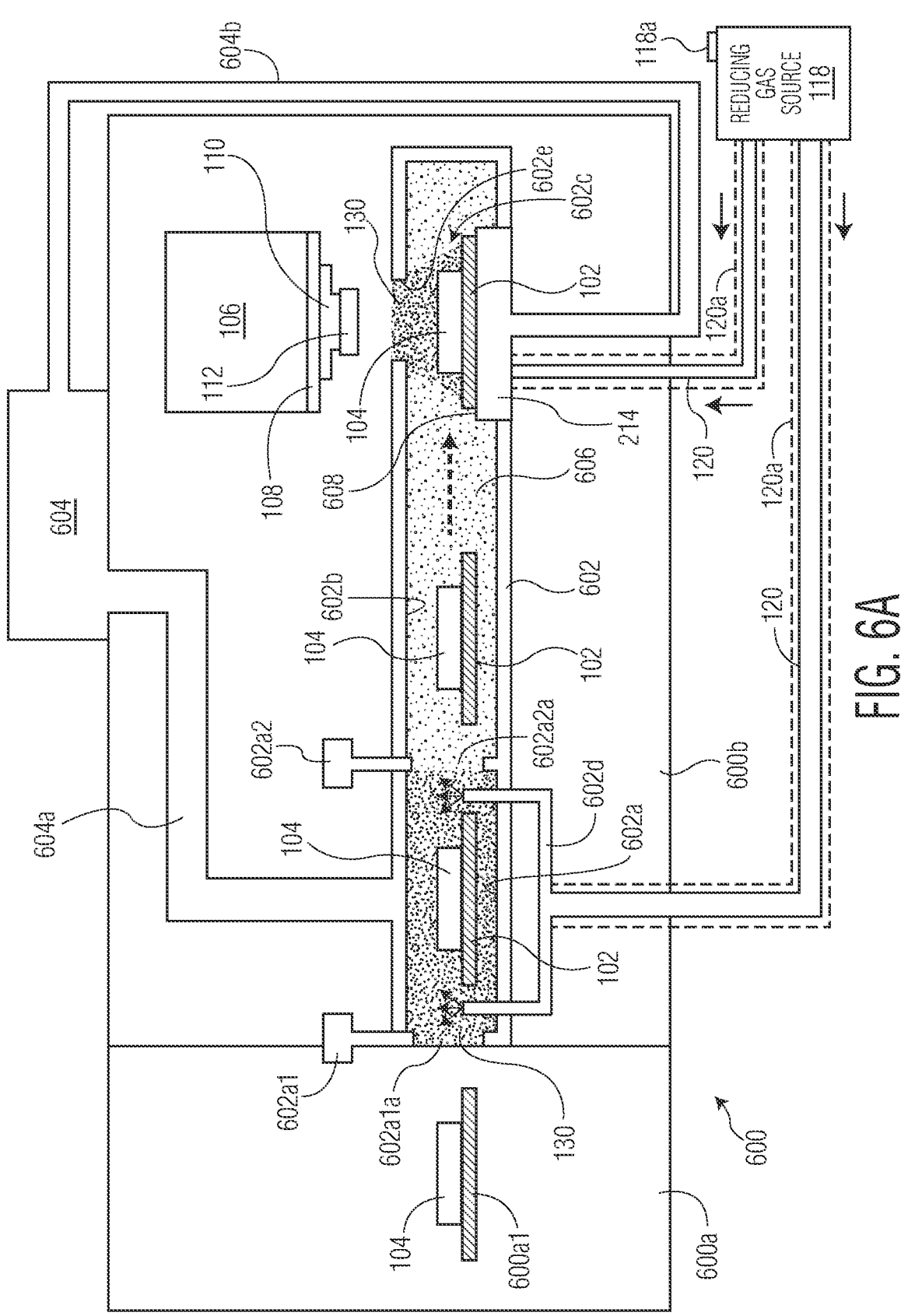

Referring now to FIGS. 6A, a bonding system 600 is illustrated. Bonding system 600 is similar in many respects to bonding system 500 of FIG. 5A and bonding system 200 of FIG. 2, where like elements have the same reference numerals, or a numeral beginning with a "6" instead of a "5", "2", or "1" (unless explicitly indicated otherwise). Bonding system 600 is essentially bonding system 500, except processing system 600b includes a reducing gas delivery system 608 (including a manifold 214 and associated structures) in lieu of reducing gas delivery system 508 (including bond head manifold 114 and associated structures) of processing system 500b. Bonding system 600 includes a substrate source 600a (e.g., a wafer handler or other source) for providing a substrate(s) 104 (such as a wafer, a printed circuit board, etc.) on a support structure 600a1. Substrate 104 is configured to be transferred to processing system 600b (e.g., including a tunnel 602). Tunnel 602 (or another structure, as desired) includes a substrate oxide reduction chamber 602a, a substrate oxide prevention chamber 602b, and a bonding location 602c (which is part of substrate oxide prevention chamber 602b).

In the example illustrated in FIG. 6A, at least a portion of a substrate oxide reduction chamber 602a has a common boundary with a substrate oxide prevention chamber 602b because tunnel 602 includes both substrate oxide reduction chamber 602a and a substrate oxide prevention chamber 602b. Reducing gas delivery system 608 is also included in processing system 600b. Substrate oxide reduction chamber 602a is closed using an entry door 602a1 (which closes an opening 602a1a) and an exit door 602a2 (which closes an opening 602a2a). Another reducing gas delivery system 602d (which is illustrated indirectly interconnected with reducing gas delivery system 608 to use a common source of reducing gas, namely reducing gas source 118) provides a reducing gas 130 (e.g., formic acid vapor) in substrate oxide reduction chamber 602a. After processing (e.g., removal of oxides from conductive structures of substrate 104) in substrate oxide reduction chamber 602a, a substrate transfer system (which may be part of a material handling system including a support structure 102) is used to transfer substrate 104 through opening 602a2a to substrate oxide prevention chamber 602b. Substrate oxide prevention chamber 602b includes an inert environment 606 (e.g., through a nitrogen supply, not shown for simplicity). A material handling system (e.g., including support structure 102) is used to move substrate 104 within substrate oxide prevention chamber 602b to a bonding location 602c. While at bonding location 602c, a reducing gas 130 is provided by reducing gas delivery system 608.

FIG. 6A also illustrates bond head assembly 106, including heater 108, and bonding tool 110 (see detailed description in connection with FIG. 1). Bonding tool 110 is capable of carrying semiconductor element 112 through opening 602e in connection with a bonding operation. FIG. 6A also illustrates main exhaust 604 which pulls exhaust gases (e.g., gases such as reducing gas vapors) through piping 604a and 604b. A manifold 214 is provided for receiving and distributing fluids (e.g., gases, vapors, etc.) as desired in the given application.

Gas delivery line 120 is configured for carrying reducing gas 130 from reducing gas source 118 to reducing gas delivery system 608 and then bonding area (e.g., including bonding location 602c), where reducing gas 130 is configured for use during bonding (e.g., thermocompression bonding, flip chip bonding, etc.) of semiconductor element 112 to substrate 104. In the embodiment illustrated in FIG. 6A (and FIG. 6B), gas delivery line 120 is configured to carry reducing gas 130 to substrate oxide reduction chamber 602a (which is configured to receive substrate 104) prior to bonding of a semiconductor element 112 to the substrate 104. Further, gas delivery line 120 is configured to carry reducing gas 130 to support structure 102 (e.g., via manifold 214). A heating element 120a is provided for increasing the temperature of gas delivery line 120, and in turn, the reducing gas 130 flowing through gas delivery line 120 prior to reducing gas 130 reaching the bonding area.

Figure 6B:
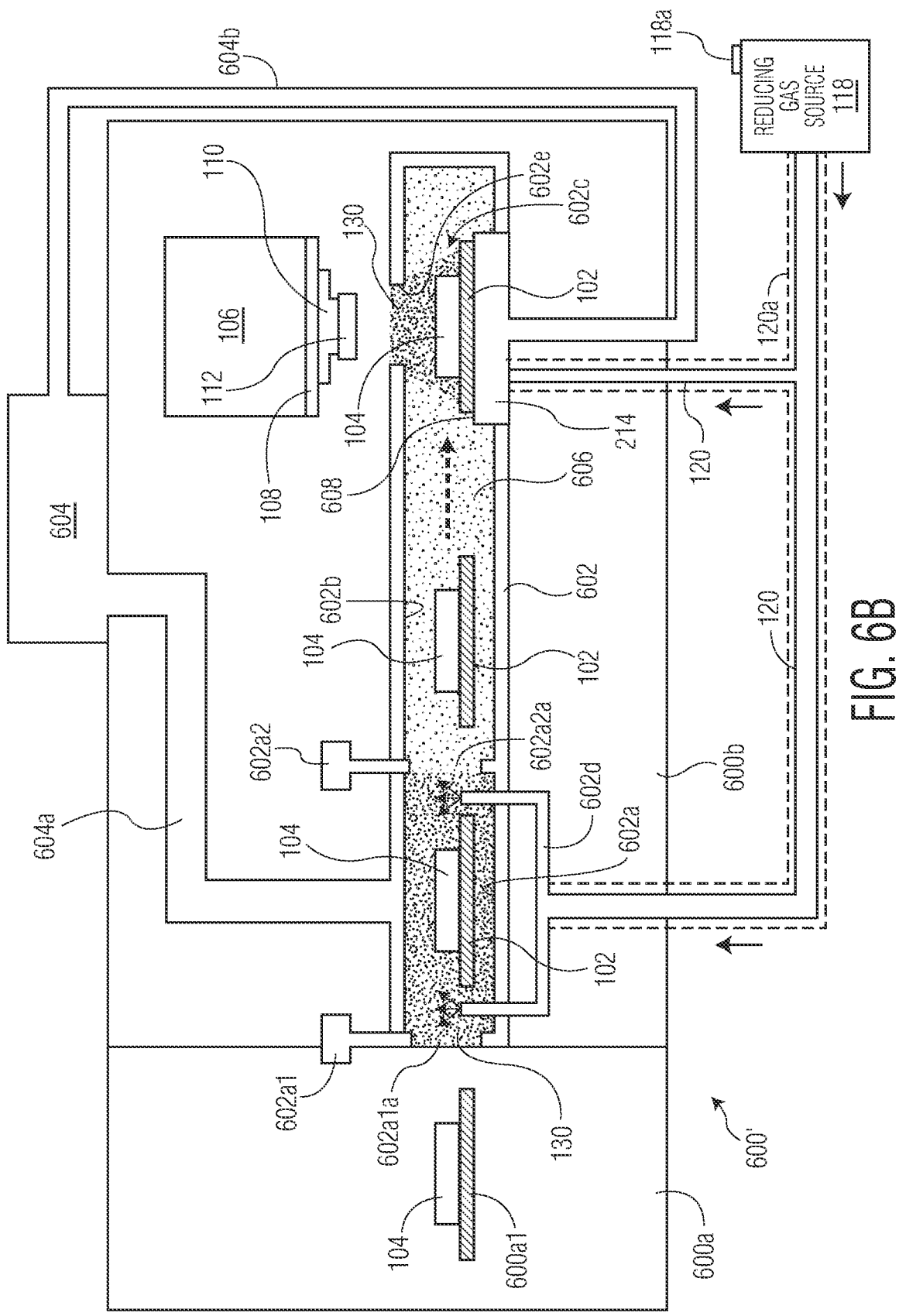

FIG. 6B illustrates bonding system 600'. Bonding system 600' is the same as bonding system 600, except bonding system 600 illustrates multiple branches of gas delivery line 120 (including a plurality of heating elements 120a) extending from reducing gas source 118, whereas bonding system 600' illustrates a single gas delivery line 120 (including a single heating element 120a) extending from reducing gas source 118 and then branching into two portions of gas delivery line 120 (i.e., one branch of gas delivery line 120 extending to substrate oxide reduction chamber 602a and the other branch of gas delivery line 120 connecting to manifold 214). Thus, while being carried from reducing gas source 118, reducing gas 130 passes through a single heating element 120a in bonding system 600' and through a plurality of heating elements 120a in bonding system 600.

FIG. 7 is a flow diagram illustrating a method of bonding a semiconductor element to a substrate. As is understood by those skilled in the art, certain steps included in the flow diagram may be omitted; certain additional steps may be added; and the order of the steps may be altered from the order illustrated—all within the scope of the invention.

At Step 700, a reducing gas is directed from a reducing gas source to a bonding area of a bonding system using a gas delivery line (see FIGS. 1-4, 5A-5B, 6A-6B). At optional Step 702, the reducing gas source is heated. At Step 704, at least a portion of the gas delivery line is heated. At optional step 706, the reducing gas is directed from the reducing gas source to a substrate oxide reduction chamber via an additional gas delivery line, the substrate being received by the substrate oxide reduction chamber prior to step 710 (see FIGS. 5A-5B, 6A-6B). At optional Step 708, the additional gas delivery line is heated. At step 710, a semiconductor element is bonded to a substrate at the bonding area.

Aspects of the invention relate to heating not only the gas delivery line (or a portion thereof), but also to heating the manifold (e.g., manifold 114, manifold 214, etc.) that distributes the reducing gas. In the illustrated embodiments, a heating element 120a is illustrated which may, if desired, extend to heating the relevant portion of the manifold (e.g., inner channel 114c of manifold 114, inner channel 214c of manifold 214, etc.). However, it is understood that a separate heating element may be provided for heating the relevant portion of the respective manifold. Thus, the portion of heating element 120a shown in the drawings extending into the respective manifold should be considered as part of the same heating element(s) for heating the gas delivery line, or a separate heating element(s).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A bonding system for bonding a semiconductor element to a substrate, the bonding system comprising:
    a reducing gas delivery system configured to provide a reducing gas to a bonding area of the bonding system; and
    a gas delivery line configured to transport the reducing gas from a reducing gas source to the reducing gas delivery system, at least a portion of the gas delivery line being heated,
    wherein the gas delivery line is heated according to a heat profile,
    wherein the heat profile includes a time-based heating process having a first temperature setpoint prior to bonding and a second temperature setpoint during bonding.

2. The bonding system of claim 1 wherein the reducing gas is a formic acid vapor.

3. The bonding system of claim 2 wherein the formic acid vapor has a concentration of 4-15% formic acid.

4. The bonding system of claim 1 further comprising a heating element for heating the gas delivery line.

5. The bonding system of claim 1 further comprising a bonding tool configured to carry the semiconductor element and to bond the semiconductor element to the substrate in connection with a bonding operation.

6. The bonding system of claim 1 wherein the heat profile is at least partially determined using a temperature of the reducing gas source, wherein the heat profile includes a temperature greater than the temperature of the reducing gas source.

7. The bonding system of claim 6 wherein the temperature of the reducing gas source is 20° C.-70° C.

8. The bonding system of claim 1 wherein the reducing gas source is a bubbler type system.

9. The bonding system of claim 1 further comprising a substrate oxide prevention chamber configured to receive a substrate prior to bonding a semiconductor element to a substrate, the substrate oxide prevention chamber having an inert environment when receiving the substrate.

10. The bonding system of claim 1 wherein an entire length of the gas delivery line, from the reducing gas source to the reducing gas delivery system, is heated.

11. The bonding system of claim 1 wherein at least a portion of the gas delivery line is heated above a dew point of the reducing gas to reduce a potential for condensation of the reducing gas.

12. A method of bonding a semiconductor element to a substrate, the method comprising the steps of:

(a) directing a reducing gas from a reducing gas source to a bonding area of a bonding system using a gas delivery line;

(b) heating at least a portion of the gas delivery line according to a heat profile, wherein the heat profile includes a time-based heating process having a first temperature setpoint prior to bonding and a second temperature setpoint during bonding; and (c) bonding the semiconductor element to the substrate at the bonding area.

13. The method of claim 12 wherein step (a) includes delivering the reducing gas to the bonding area via a reducing gas delivery system.

14. The method of claim 12 wherein the reducing gas is a formic acid vapor.

15. The method of claim 14 wherein the formic acid vapor has a concentration of 4-15% formic acid.

16. The method of claim 12 wherein the bonding of step (c) includes using a bonding tool configured to carry and bond the semiconductor element to the substrate in connection with a bonding operation.

17. The method of claim 12 wherein step (b) includes heating the gas delivery line according to a heat profile, wherein the heat profile is at least partially determined using a temperature of the reducing gas source.

18. The method of claim 12 further comprising the step of heating the reducing gas source.

19. The method of claim 12 wherein step (b) includes heating the gas delivery line using a heating element.

20. The method of claim 12 wherein the reducing gas source is a bubbler type system.

21. The method of claim 12 wherein step (b) includes heating an entire length of the gas delivery line from the reducing gas source to the reducing gas delivery system.

22. The bonding system of claim 1 wherein the reducing gas delivery system includes a manifold configured to provide the reducing gas to the bonding area, at least a portion of the manifold being heated.

23. The bonding system of claim 22 further comprising a heating element for heating the gas delivery line and the manifold.

24. The bonding system of claim 22 further comprising a heating element for heating the gas delivery line, and another heating element for heating the manifold.

25. The method of claim 12 wherein the reducing gas delivery system includes a manifold configured to provide the reducing gas to the bonding area, and wherein step (b) includes heating the manifold.

26. The method of claim 25 wherein step (b) includes heating (i) at least the portion of the gas delivery line, and (ii) the manifold, with a heating element.

27. The method of claim 25 wherein step (b) includes heating at least the portion of the gas delivery line with a heating element, and heating the manifold with another heating element.

28. The method of claim 12 wherein step (b) includes heating at least a portion of the gas delivery line above a dew point of the reducing gas to reduce a potential for condensation of the reducing gas.

29. A bonding system for bonding a semiconductor element to a substrate, the bonding system comprising:
    a reducing gas delivery system configured to provide a reducing gas to a bonding area of a bonding system during a bonding operation;

a gas delivery line configured to transport the reducing gas from a reducing gas source to the reducing gas delivery system, at least a portion of the gas delivery line being heated; and a bonding tool configured to carry the semiconductor element and to bond the semiconductor element to the substrate in connection with the bonding operation.

* * * * *